United States Patent [19]

Hiraishi et al.

[11] Patent Number: 4,780,391

[45] Date of Patent: Oct. 25, 1988

[54] COLOR-IMAGE RECORDING MATERIAL

[75] Inventors: Shigetoshi Hiraishi; Toshihiko Matsushita, both of Tokyo; Sadao Morishita, Ushiku, all of Japan

[73] Assignee: Mitsubishi Paper Mills, Ltd., Tokyo, Japan

[21] Appl. No.: 907,826

[22] Filed: Sep. 16, 1986

[30] Foreign Application Priority Data

| Sep. 27, 1985 | [JP] | Japan | 60-215266 |
| Sep. 27, 1985 | [JP] | Japan | 60-215267 |
| Sep. 27, 1985 | [JP] | Japan | 60-215268 |
| Oct. 2, 1985 | [JP] | Japan | 60-220949 |
| Oct. 2, 1985 | [JP] | Japan | 60-220950 |
| Jun. 9, 1986 | [JP] | Japan | 61-134479 |

[51] Int. Cl.$^4$ ............................................. B41M 5/20
[52] U.S. Cl. ............................ 430/138; 427/256; 427/286; 428/195; 428/206; 428/207; 428/321.5; 428/913
[58] Field of Search ............ 428/201, 203, 204, 206, 428/207, 211, 320.2, 321.5, 913, 914; 430/138; 346/135.1

[56] References Cited

U.S. PATENT DOCUMENTS 4,397,483  8/1983  Hiraishi et al. .................. 428/321.5

FOREIGN PATENT DOCUMENTS

| 6102460 | 5/1960 | Australia | 430/138 |
| 1272059 | 7/1960 | France | 430/138 |
| 2113860 | 8/1983 | United Kingdom | 430/138 |

Primary Examiner—John E. Kittle
Assistant Examiner—P. R. Schwartz
Attorney, Agent, or Firm—Cushman, Darby & Cushman

[57] ABSTRACT

There is disclosed a color-image recording material comprising a support and a combination of two or more layers, provided on said support, which contain individually or in combination (a) microcapsules enclosing chiefly a photohardenable resin or microcapsules enclosing chiefly a photohardenable resin and a colorant, (b) a lightproof white material, and (c) a colorant, the layer containing the lightproof white material being provided directly or indirectly on a picture element layer in which two or more picture elements comprising a colorant or microcapsules enclosing chiefly a photohardenable resin and a colorant are arranged in a striped pattern or a mosaic pattern.

12 Claims, No Drawings

COLOR-IMAGE RECORDING MATERIAL

BACKGROUND OF THE INVENTION

This invention relates to a recording material capable of forming a color image by use of photohardenable microcapsules and to a process for the formation of a color image by the use of said recording material.

Known processes for the formation of a color image include silver salt photographic processes excellent in resolving power and nonsilver processes such as electrostatic recording processes and electrophotographic processes. Although inferior in the quality of color image to the silver salt photographic process, the non-silver process is capable of tone reproduction and is used in the reproduction of color images.

Such known processes, however, are complicated in the operation to produce a color image and need an equipment of large size which requires an elaborated maintenance, thus resulting in an increase in the cost of reproduction.

Further, the recent progress in computers aroused a demand for reproducing as a hard copy the color image displayed on cathode ray tubes (CRT) or the like, thereby to allow the color image to be observed closely by holding the hard cpy in observer's hands. To meet the demand, there have been shown several processes for the formation of color images by converting the image into electrical signals. Representatives of such processes are a thermal transfer process and an ink-jet printing process. In the former process a thermal head is used to transfer to an image receiving sheet at least one color from a transfer sheet coated with a plurality of coloring materials. Although the equipment is small in size and is free of maintenance, this process has disadvantages in that the sharpness of reproduced image is unsatisfactory because the resolving power depends on the size of heated part of the thermal head, and an additional labor is required in the disposal of waste transfer sheet after the image formation.

In the ink-jet printing process, an image is formed on the image receiving sheet by the impingement of flying ink droplets delivered from nozzles. This process has disadvantages in that the nozzles are susceptible to clogging with the ink and at least three nozzles are necessary because inks of different colors must be delivered from independent nozzles.

There is, therefore, a strong desire for the development of a process for the formation of a color image, which is simple in the procedure and requires an equipment small in size and free of maintenance. Japanese Patent Application "Kokai" (Laid-open) No. 230,786/84 discloses a process for the formation of a color image to meet the above desire. Unfortunately, this process is insufficient in the image resolution.

SUMMARY OF THE INVENTION

A primary object of this invention is to provide a recording material capable of forming, by a simple procedure, a color image excellent in resolution and in image preservation.

Another object of this invention is to provide a process for the formation of the color image.

The primary object of this invention has been achieved by the color-image recording material comprising a support and a combination of two or more layers, provided on said support, which contain individually or in combination (a) microcapsules enclosing chiefly a photohardenable resin or microcapsules enclosing chiefly a photohardenable resin and a colorant, (b) a lightproof white material, and (c) a colorant, the layer containing the lightproof white material being provided directly or indirectly on a picture element layer in which two or more picture elements comprising a colorant or microcapsules enclosing chiefly a photohardenable resin and a colorant are arranged in a striped pattern or a mosaic pattern.

The above-mentioned another object of this invention has been achieved by a process for forming a color image, which comprises exposing the said color-image recording material in accordance with the image signals and then applying heat and/or pressure to all over the surface.

DESCRIPTION OF THE INVENTION

According to this invention, there are obtained various color-image recording materials having different layer structures by combining individually or in admixture (a) a layer containing microcapsules enclosing chiefly a photohardenable resin or a mixture of a photohardenable resin and one or more colorants, (b) a layer containing chiefly a light-proofing white material, and (c) a layer containing chiefly one or more colorants. As examples of such recording materials, mention may be made of the following.

A color-image recording material comprising a support, a picture element layer, provided on said support, composed of picture elements, in two or more colors, which are arranged in a striped pattern or a mosaic pattern, and a light-proofing white material layer, provided on said picture element layer, composed of a light-proofing white material and microcapsules containing therein chiefly a photohardenable resin.

A color-image recording material comprising a support, a picture element layer, provided on said support, composed of picture elements of colorants, in two or more colors, which are arranged in a striped or mosaic pattern, a layer of microcapsules, provided on said picture element layer, containing therein chiefly a photohardenable resin, and a light-proofing white material layer, provided on said microcapsule layer, containing chiefly a light-proofing white material.

A color-image recording material comprising a support, a picture element layer, provided on said support, composed of picture elements, in two or more colors, which are arranged in a striped pattern or a mosaic pattern, a light-proofing white material layer, provided on said picture element layer, composed of chiefly a light-proofing white material, and a layer, provided on said light-proofing white material layer, composed of microcapsules containing therein chiefly a photohardenable resin.

A color-image recording material comprising a support, a picture element layer, provided on said support, composed of those picture elements of two or more colorants which are mixed with microcapsules containing therein chiefly a photohardenable resin and which are arranged in a striped pattern or a mosaic pattern, and a lightproofing white material layer composed of a lightproofing white material.

A color-image recording material comprising a support, a picture element layer, provided on said support, composed of those picture elements, in two or more colors, which comprise microcapsules containing therein chiefly a photohardenable resin and a colorant and which are arranged in a striped pattern or a mosaic pattern, and a lightproofing white material layer, provided on said picture element layer, composed of a lightproofing white material.

In all of the layer structures, the same image forming procedure can be used. It is carried out by optically converting the image signals from CRT and the like, which correspond to blue, green, and red, and exposing the corresponding picture elements of yellow, magenta, and cyan provided on the color-image recording material with ultraviolet, visible, or infrared rays through the front or back side of the recording material. The wavelengths of the exposure rays can be freely selected so long as the photohardenable resin used in the recording material can be polymerized. After the exposure, heat or pressure is applied to the entire surface of the recording material to rupture the microcapsules in the unexposed area, thereby to releae the liquid substance enclosed in the microcapsules. The released liquid substance migrates to the lightproof white layer and makes the layer selectively transparent. Thus, the picture elements become visible through the transparent portions of the lightproof white material layer and are recognized as a color image.

The picture element layer according to this invention is formed by arranging in a striped or mosaic pattern two or more colorants, preferably yellow, magenta, cyan, and, if necessary, black, as such or as a mixture with microcapsules containing therein chiefly a photohardenable resin or as enclosed together with a photohardenable resin in the microcapsules. Since the picture element layer forms the final color image, each picture element is preferably minimized in size in order to produce an image excellent in quality, particularly in resolution. The width of each element is 1 to 500µ, preferably 5 to 250µ, most preferably 5 to 120µ. The colorants used in the picture elements can be either dyes or pigments so long as the color balance in the combinations is satisfactory. From the viewpoint of image stability, colorants of good shelf stability are preferred. Two or more colorants may be used in combination for one picture element.

As examples of suitable colorants, mention may be made of the following.

Pigments: zinc oxide, white lead, lead sulfate, basic lead sulfate, lithopone, zinc sulfide, titanium oxide, and antimony oxide among white pigments; carbon black, acetylene black, lamp black, bone black, graphite, iron black, mineral black, Aniline Black, and Cyanine Black among black pigments; yellow lead, zinc yellow, barium chromate, cadmium yellow, yellow iron oxide, loess, titanium yellow, lead cyanamide, calcium plumbate, Naphthol Yellow S, Hansa Yellow 10G, Hansa Yellow 5G, Hansa Yellow 3G, Hansa Yellow G, Hansa Yellow GR, Hansa Yellow A, Hansa Yellow RN, Hansa Yellow R, Pigment Yellow L, Benzidine Yellow, Benzidine Yellow G, Benzidine Yellow GR, Permanent Yellow NCG, Vulcan Fast Yellow 5G,Vulcan Fast Yellow R, Tartrazine Lake, Quinoline Yellow Lake, Anthragen Yellow 6GL, Permanent Yellow FGL, Permanent Yellow H10G, Permanent Yellow HR, and Anthrapyrimidine Yellow among yellow pigments; Chrome Orange, Chrome Vermilion, Sudan I, Permanent Orange, Lithol Fast Orange, Permanent Orange GTR, Hansa Yellow 3R, Vulcan Fast Orange GG, Benzidine Orange G, Persian Orange, Indanthren Brilliant Orange GK, Indanthren Brilliant Orange RK, and Indanthren Brilliant Orange among orange pigments; iron oxide, umber, Permanent Brown, and Para Brown among brown pigments; red iron oxide, red lead, vermilion, cadmium red, cadmium mercury red, antimony vermilion, Permanent Red 4R, Para Red, Fire Red, p-Chloro-o-nitroaniline Red, Lithol Fast Scarlet G, Brilliant Fast Scarlet, Brilliant Carmine BS, Permanent Red F2R, Permanent Red F4R, Permanent Red FRL, Permanent Red FRLL, Permanent Red F4RH, Fast Scarlet VD, Vulcan Fast Rubine B, Vulcan Fast Pink G, Light Fast Red Toner B, Light Fast Red Toner R, Permanent Carmine FB, Pyrazolone Red, Lithol Red, Lake Red C, Lake Red D, Anthosine B, Brilliant Scarlet G, Lithol Rubine GK, Permanent Red F5R, Brilliant Carmine 6B, Pigment Scarlet 3B, Bordeaux 5B, Toluidine Maroon, Permanent Bordeaux F2R, Helio Bordeaux BL, Bordeaux 10B, BON Maroon Light, BON Maroon Medium, Eosine Lake, Rhodamine Lake B, Rhodamine Lake Y, Alizarine Lake, Thioindigo Red B, Thioindigo Maroon, Permanent Red FGR, PV carmine HR, Monolite Fast Red YS, and Permanent Red BL among red pigments; Cobalt Violet, Manganese Violet, Fast Violet B, Methyl Violet Lake, and Dioxazine Violet among violet pigments; ultramarine, prussian blue, cobalt blue, cerulean blue, Alkali Blue Lake, Peacock Blue Lake, Victoria Blue Lake, Metal-free Phthalocyanine Blue, Phthalocyanine Blue, Fast Sky Blue, Indanthrene Blue RS, Indanthrene Blue BC, and Indigo among blue pigments; and Chrome Green, Zinc Green, chromium oxide, Veridian, Emerald Green, cobalt green, Pigment Green B, Naphthol Green B, Green Gold, Acid Green Lake, Malachite Green Lake, Phthalocyanine Green, and Polychlorobromo-copper-Phthalocyanine among green pigments.

Dyes: Dyes can be selected from colored dyes such as monoazo, disazo, metal complex monoazo dyes, anthraquinone dyes, phthalocyanine dyes, and triarylmethane dyes. Examples, shown in Color Index number, are 11020, 11021, 12055, 12700, 18690, 18820, and 47000 among yellow dyes; 12010, 12150, 12715, 26105, 26125, 27291, 45170 B, and 60505 among red dyes; 61565 among green dyes; 61100, 61705, 61525, 62100, 42563 B, and 74350 among blue dyes; and 12195, 26150, and 50415 among black dyes.

The picture element layer is easily obtained by coating a support, by customary printing techniques such as gravure printing using a hydrophilic or lipophilic binder, with the above-mentioned colorants as such or as enclosed together with a photohardenable resin in microcapsules or as a mixture with microcapsules containing therein chiefly a photohardenable resin.

The microcapsules containing therein chiefly a photohardenable resin, that is, photohardenable microcapsules used according to this invention have the following features.

Conventional microcapsules enclosing therein a liquid or solid substance are used to isolate the contents from other substances existing nearly. When necessary, the microcapsules are exposed to heat and/or pressure to rupture the microcapsules and release the contents to react or mix with other substances which come into contact with the contents. Therefore, when exposed to heat and/or pressure, conventional microcapsules coated on a support are inevitably ruptured to exude the contents. As contrasted, in the case of photohardenable microcapsules, the rupture by heat and/or pressure is controlled by light rays. When it is required to take out the contents, the microcapsules are ruptured by applying heat and/or pressure, thereby to exude the contents.

Conversely, when it is required to keep the contents from exudation, the microcapsules are exposed to light rays, thereby to harden the photohardenable resin enclosed therein by the rays transmitted through the microcapsule shells. The contents of the microcapsules change into a hard resin from a liquid or soft resin, resulting in rigid microcapsules which, upon being applied with external heat and/or pressure, will no longer be ruptured to keep the contents from exudation.

The photohardenable resins enclosed within the microcapsules are photodimerizable resins such as, for example, those having photosensitive groups such as cinnamic acid moiety, cinnamylidene moiety, $\alpha,\beta$-unsaturated ketone moiety, coumarin moiety, anthracene moiety, $\alpha$-phenylmaleimide moiety, benzophenone moiety, and stilbene moiety; and photopolymerizable resin such as, for example, those having acryloyl group, allyl group, vinyl group, and epoxy group. Of these, photopolymerizable resins in liquid form are preferred. The photopolymerization initiators usually used in photopolymerization are also used in the present invention. As examples, mention may be made of benzophenones, benzoin alkyl ethers, Michler's ketones, thioxanthones, sulfides, diazo compounds, acetophenones, peroxides, aromatic amines, anthraquinones, and halogenated compounds. Sensitizers used to enlarge the range of sensitive wavelengths are nitro compounds, amino compounds, ketones, quinones, and anthrones.

In order to improve the preservative stability, stabilizers such as radical polymerization inhibitors, modifiers, and diluents such as oligomers of relatively low molecular weight or monomers can be included in the photohardenable microcapsules. It is also possible to include in the microcapsules those organic compounds which migrate from the ruptured microcapsules to the lightproof white layer to make the latter transparent. Such organic compounds are preferably those which have refractive indices comparable to that of the lightproof white layer. Such organic compounds in liquid form having a high boiling point are preferred. As examples, there may be mentioned alkylnaphthalenes, alkylbiphenyls, alkylidenebiphenyls, and esters. The amount to be added of these compounds should not be large, because it affects the hardening degree of microcapsule contents. The size of the photohardenable microcapsules can be freely controlled in the manufacturing stage. The size is preferably small, because it affects the quality of final color image. The size is preferably less than the width of each picture element in the picture element layer. It is generally 1 to 50$\mu$, preferably 2 to 20$\mu$.

The light rays used in hardening the photohardenable microcapsules can be ultraviolet, visible, or infrared rays. The light sources include daylight, xenon lamp, low or high pressure mercury lamp, tungsten lamp, fluorescent lamp, various lasers, and others. The light source can be freely selected by properly selecting the type of photohardenable resin, sensitizer, or photopolymerization initiator enclosed in microcapsules.

The exposure can be made through the front side or back side of the color image recording material. When exposure is to be made through the front side, the materials used in the lightproof white layer should be transmissive to the rays of same wavelengths as those of rays to which the recording material is exposed. When exposure is to be made through the back side, that is, through the support, the material of support should be transmissive to the rays of the same wavelengths as those of rays to which the recording material is exposed.

The microcapsules used in this invention can be produced by the methods known to the art. Such methods include the method of phase separation from an aqueous medium as disclosed in U.S. Pat. Nos. 2,800,457 and 2,800,458; interfacial polymerization as disclosed in Japanese Patent Publication Nos. 19,574/63, 446/67, and 771/67; the method of in situ polymerization of monomers as disclosed in Japanese Patent Publication, No. 9,168/61 and Japanese Patent Application "Kokai" (Laid open) No. 9,079/76; the method of cooling the melt dispersion as disclosed in Brit. P. 952807 and 965,074; and spray drying as described in U.S. Pat. No. 3,111,407 and Brit. P. 930,422; and others. The capsule wall materials include gelatin, gum arabic, starch, sodium alginate, ethylcellulose, carboxyethylcellulose, polyvinyl alcohol, polyethylene, polyamide, polyester, polyurethane, and polyethyleneimine. The materials sufficiently transmissive to the exposure rays are preferred. The layer containing the photohardenable microcapsules can also contain capsule protecting agents such as powdered cellulose, powdered starch, and powdered plastics.

The lightproof white layer usually serves to shield the color of colorants in the picture element layer provided thereunder. The materials forming the lightproof white layer can be selected from the known white materials capable of shielding the light. As examples, mention may be made of white inorganic pigments such as zinc oxide, lead oxide, magnesium oxide, barium sulfate and titanium oxide, and finely powdered polymers such as cellulose. These substances are used either each alone or in mixtures.

The lightproof white layer is formed by coating the pigments together with a binder. The coating is applied either all over the surface of a support by means of an air-knife coater, blade coater, or gravure coater, or partially by means of a flexographic press or gravure printing press.

The support is transparent, translucent, or opaque. Examples of supports are paper, various nonwovens, synthetic paper, metal foil, plastic films and composite sheet made from said materials.

In applying the lightproof white coating, it is desirable to use a binder, generally a water-soluble binder or an aqueous latex such as, for example, gelatin, casein, carboxymethylcellulose, hydroxymethylcellulose, oxidized starch, esterified starch, polyvinyl alcohol, polyvinylpyrrolidone, polyacrylic acid, vinyl acetate-acrylic acid copolymer, acrylonitrile-butadiene copolymer, and vinylidene chloride base copolymer. These binders are used each alone or in combinations. The selection of binder is made by taking into account the film strength and dispersibility.

The invention is illustrated in detail below with reference to Examples.

EXAMPLE 1

(1) Preparation of photohardenable microcapsules

A uniform aqueous solution was prepared by mixing 100 g of a 10% aqueous solution of an ethylene-maleic anhydride copolymer, 10 g of urea, 1 g of resorcinol, and 200 g of water. The resulting solution was adjusted to pH 3.5 by the addition of an aqueous sodium hydroxide solution. A solution of 0.8 g of 2,2-dimethoxy-2-phenylacetophenone in 165.6 g of a photohardenable resin of the acrylate type was emulsified in the above aqueous solution to obtain an oil-in-water emulsion having an oil droplet of 4–8μ in size. To the emulsion, was added 2.5 parts of 37% formalin. The mixture was kept at a temperature of 55° C., stirred for 4 hours, and cooled down to room temperature to complete the microencapsulation.

(2) Preparation of color-image recording material

Recurring units of three picture elements, yellow, magenta, and cyan, were provided in stipes, each about 120μ in width, on a base paper sheet, 60μ in thickness, by gravure printing. Markers were then provided every recurring unit to complete a picture element layer. A coating composition was prepared by mixing together 300 g of the photohardenable microcapsules obtained above, 200 g of wheat starch, 20 g of a 50% SBR latex, 100 g of a 40% calcium carbonate dispersion, and 80 g of a 10% aqueous polyvinyl alcohol solution. The coating composition was applied onto the picture element layer to obtain a color-image recording material.

A color image of CRT was separated into blue, green, and red and converted into electric signals, which were subjected to optical conversion to carry out exposure of the corresponding spot on picture element of the color image recording material with ultraviolet rays. After the exposure, the recording material was passed through hot rolls to obtain a beautiful color-image.

EXAMPLE 2

Recurring units of three picture elements, yellow, magenta, and cyan, were provided in stripes, each about 120μ in width, on a base paper sheet, 60μ in thickness, by gravure printing. Markers were then provided every recurring unit to complete a picture element layer. A coating composition was prepared by intermixing 300 g of the photohardenable microcapsules obtained in Example 1, 200 g of wheat starch, and 20 g of a 50% SBR latex. The coating composition was applied onto the picture element layer and overcoated with another coating composition prepared by intermixing 100 g of a 40% calcium carbonate dispersion and 80 g of a 10% aqueous polyvinyl alcohol solution, whereby a color-image recording material was obtained.

Every part of a color image of CRT was separated into blue, green, and red and converted into electric signals, which were subjected to optical conversion to carry out exposure of the corresponding spots on the picture elements, yellow, magenta, and cyan with ultraviolet rays. After the exposure, the recording material was passed through hot rolls to obtain a beautiful color image.

EXAMPLE 3

Recurring units of three picture elements, yellow, magenta, and cyan, were provided in stripes, each about 120μ in width, on a base paper sheet, 60μ in thickness, by gravure printing. Markers were provided every recurring unit to complete a picture element layer. A coating composition prepared by mixing 100 g of a 40% calcium carbonate dispersion and 80 g of a 10% aqueous polyvinyl alcohol solution was applied onto the picture element layer and further overcoated with another coating composition prepared by intermixing 300 g of photohardenable microcapsules obtained in Example 1, 200 g of wheat starch, and 20 g of a 50% SBR latex, to obtain a color-image recording material.

Every part of a color image of CRT was separated into blue, green, and red and converted into electric signals, which were subjected to optical conversion to carry out exposure of the corresponding spots on the picture elements, yellow, magenta, and cyan with ultraviolet rays. After exposure, the recording material was passed through hot rolls to obtain a beautiful color image.

EXAMPLE 4

Recurring units of three picture elements, yellow, magenta, and cyan, containing photohardenable microcapsules obtained in Example 1, were provided in stripes, each about 120μ in width, on a base paper sheet, 60μ in thickness, by gravure printing. Markers were provided every recurring unit to complete a picture element layer. The picture element layer was overcoated with a mixture of 100 g of a 40% calcium carbonate suspension and 80 g of a 10% aqueous polyvinyl alcohol solution, to obtain a color image recording material.

Every part of a color image of CRT was separated into blue, green, and red and converted into electric signals, which were subjected to optical conversion to carry out exposure of the corresponding spots on the picture elements, yellow, magenta, and cyan, with ultraviolet rays. After exposure, the recording material was passed through hot rolls to obtain a beautiful color image.

EXAMPLE 5

(1) Photohardenable microcapsules enclosing yellow pigment

An aqueous solution was prepared by intermixing 100 parts of a 10% aqueous solution of an ethylene-maleic anhydride copolymer, 10 parts of urea, 1 part of resorcinol, and 200 parts of water. The resulting solution was adjusted to pH 3.5 by the addition of an aqueous sodium hydroxide solution. A mixture was prepared by adding 0.8 part of 2,2-dimethoxy-2-phenylacetophenone to a uniform dispersion of 14.4 parts of Permanent Yellow H10G in 165.6 parts of an epoxyacrylate-base photohardenable resin. The resulting mixture was emulsified in the aqueous solution obtained above to produce an oil-in-water emulsion of 4–8μ in oil droplet size. To the emulsion, was added 2.5 parts of 37% formalin. The resulting mixture was kept at a temperature of 55° C., stirred for 4 hours, and then cooled down to room temperature to complete the microencapsulation.

(2) Photohardenable microcapsules enclosing magenta pigment

Microcapsules were prepared in the same manner as in (1), except that Permanent Carmine FB, a magenta pigment, was used in place of the yellow pigment.

(3) Photohardenable microcapsules enclosing cyan pigment

Microcapsules were prepared in the same manner as in (1), except that Phthalocyanine Blue, a cyan pigment, was used in place of the yellow pigment.

(4) To 100 g of the dispersion of each photohardenable microcapsules, were added 50 g of wheat starch and 200 g of a 40% ethanol solution of a styrene-maleic anhydride copolymer. Using the resulting inks, stripes of yellow, magenta, and cyan were printed in the indicated order by flexographic printing on a base paper, 60 g/m$^2$ in basis weight, to obtain a picture element layer.

(5) A mixed composition comprising 100 g of a 40% calcium carbonate dispersion and 80 g of an aqueous polyvinyl alcohol solution was coated on the picture element layer to produce a color-image recording material.

(6) Every part of a color image of CRT was separated into blue, green, and red and converted into electric signals, which were then subjected to optical conversion to carry out exposure of the corresponding spots on the picture elements, yellow, magenta, and cyan of the recording material to ultraviolet rays. After the exposure, the recording material was passed through hot rolls to obtain a beautiful color image.

The color-image recording material of the present invention is capable of easily reproducing a color-image by the use of light, heat and/or pressure. It is, therefore, highly significant in the field where a high demand exists for the color-image recording.

We claim:

1. A color-image recording material which comprises a support and at least two layers which contain the following (a), (b) and (c) independently or in combination:
   (a) microcapsules enclosing chiefly a photohardenable resin or microcapsules enclosing chiefly a photohardenable resin and a colorant,
   (b) a light-proofing white material and
   (c) a colorant, a layer comprising the light-proofing white material alone or comprising the light-proofing white material and the microcapsules containing photohardenable resin being provided directly or indirectly on a picture element layer in which two or more picture elements comprising colorants selected from the three colors yellow, magenta and cyan or microcapsules enclosing chiefly a photohardenable resin and a colorant are arranged in a striped pattern or a mosaic pattern selected from the three colors yellow, magenta, and cyan.

2. A color-image recording material according to claim 1 which comprises a support, a picture element layer, provided on the support, composed of picture elements, in two or more colors, which are arranged in a striped pattern or a mosaic pattern and the light-proofing white layer, provided on said picture element layer, containing the light-proofing white material and the microcapsules enclosing chiefly a photohardenable resin.

3. A process for formation of a color-image which comprises subjecting the color-image recording material according to claim 2 to an exposure corresponding to an image signal and then subjecting to the entire surface of the color-image recording material to application of heat and/or pressure.

4. A color-image recording material according to claim 1 which comprises a support, a picture element layer, provided on said support, composed of picture elements, in two or more colors, which are arranged in a striped pattern or a mosaic pattern, a layer containing microcapsules enclosing chiefly a photohardenable resin provided on said picture element layer and a light-proofing white layer comprising a light-proofing white material provided on said microcapsule-containing layer.

5. A process for formation of a color-image which comprises subjecting the color-image recording material according to claim 4 to an exposure corresponding to an image signal and then subjecting the entire surface of the color-image recording material to application of heat and/or pressure.

6. A color-image recording material according to claim 1 which comprises a support, a picture element layer, provided on said support, composed of picture elements of colorants, in two or more colors, which are arranged in a striped pattern or a mosaic pattern, a light-proofing white layer comprising a light-proofing white material provided on said picture element layer and a layer containing microcapsules enclosing chiefly a photohardenable resin provided on said light-proofing white layer.

7. A process for formation of a color-image which comprises subjecting the color-image recording material according to claim 6 to an exposure corresponding to an image signal and then subjecting the entire surface of the color-image recording material to application of heat and/or pressure.

8. A color-image recording material according to claim 1 which comprises a support, a picture element layer, provided on said support, composed of a mixture of microcapsules enclosing chiefly a photohardenable resin with picture elements of at least two colors composed of colorants which are arranged in a striped pattern or mosaic pattern and a light-proofing white layer comprising a light-proofing white material provided on said picture element layer.

9. A process for formation of a color image which comprises subjecting the color-image recording material according to claim 5 to an exposure corresponding to an image signal and then subjecting the entire surface of the color-image recording material to application of heat and/or pressure.

10. A color-image reocrding material according to claim 1 which comprises a support, a picture element layer composed of a picture elements of microcapsules enclosing chiefly a photohardenable resin and a colorant, in at least two colors which are arranged in a striped or mosaic pattern and a light-proofing white layer comprising a light-proofing white material provided on said picture element layer.

11. A process for formation of a color-image which comprises subjecting the color-image recording material according to claim 10 to an exposure corresponding to an image signal and then subjecting the entire surface of the color-image recording material to application of heat and/or pressure.

12. A process for formation of a color-image which comprises subjecting the color-image recording material according to claim 1 to a light exposure corresponding to an image signal and then subjecting the entire surface of the color-image recording material to application of heat and/or pressure.

* * * * *